(12) United States Patent
Bolden, II

(10) Patent No.: US 7,455,735 B2
(45) Date of Patent: Nov. 25, 2008

(54) WIDTH ADJUSTABLE SUBSTRATE SUPPORT FOR PLASMA PROCESSING

(75) Inventor: Thomas V. Bolden, II, Fremont, CA (US)

(73) Assignee: Nordson Corporation, Westlake, OH (US)

( * ) Notice: Subject to any disclaimer, the term of this patent is extended or adjusted under 35 U.S.C. 154(b) by 438 days.

(21) Appl. No.: 11/239,570

(22) Filed: Sep. 28, 2005

(65) Prior Publication Data
US 2007/0068455 A1 Mar. 29, 2007

(51) Int. Cl.
C23C 16/00 (2006.01)
C23F 1/00 (2006.01)
H01L 21/306 (2006.01)
H01L 21/683 (2006.01)
A47H 1/14 (2006.01)
A47H 1/10 (2006.01)
A47B 91/00 (2006.01)
F16M 13/00 (2006.01)
B25B 11/00 (2006.01)
B23Q 3/00 (2006.01)
B25G 3/22 (2006.01)

(52) U.S. Cl. .................. 118/729; 118/728; 118/719; 118/723 E; 156/345.31; 156/345.43; 248/256; 248/257; 248/265; 248/346.07; 248/685; 269/21; 269/305; 269/905; 279/128; 361/234

(58) Field of Classification Search .............. 118/723 E, 118/729, 719; 156/345.31, 345.43; 269/21, 269/305, 905; 279/128; 361/234; 248/256, 248/257, 265, 346.07, 685, 122.1, 128, 924, 248/354.1, 172, 178.1, 269
See application file for complete search history.

(56) References Cited

U.S. PATENT DOCUMENTS

| 5,075,530 | A | | 12/1991 | Lee |
| 5,149,967 | A | * | 9/1992 | Otaka ..................... 250/310 |
| 5,895,549 | A | * | 4/1999 | Goto et al. ............. 156/345.51 |
| 6,245,189 | B1 | | 6/2001 | Rigali et al. ................. 156/345 |
| 6,709,522 | B1 | | 3/2004 | Condrashoff et al. ....... 118/719 |
| 6,808,592 | B1 | | 10/2004 | Rigali et al. ........... 156/345.31 |
| 6,841,033 | B2 | | 1/2005 | Condrashoff et al. .. 156/345.31 |
| 6,852,169 | B2 | | 2/2005 | Fazio et al. ................. 118/718 |

(Continued)

FOREIGN PATENT DOCUMENTS

EP 0572716 A1 12/1993

OTHER PUBLICATIONS

Austrian Patent Office, Search Report issued in corrresponding Austrian Application No. 200606058-6 dated Jun. 4, 2008 (4 pages).

Primary Examiner—Michael Cleveland
Assistant Examiner—Keath T Chen
(74) Attorney, Agent, or Firm—Wood, Herron & Evans LLP

(57) ABSTRACT

An electrode assembly for use in a plasma processing system that includes removable rails that are adjustable for reconfiguring the electrode to accommodate substrates of different widths. The electrode assembly includes an electrode having a plurality of first connecting members. Associated with the electrode is a plurality of rails that cooperate for supporting the substrates on the electrode. Each of the rails includes a plurality of second connecting members. Each of the second connecting members is connected detachably with one of the first connecting members for removably mounting the rails with the electrode.

20 Claims, 5 Drawing Sheets

U.S. PATENT DOCUMENTS

| | | | |
|---|---|---|---|
| 2002/0170877 A1 | 11/2002 | Fazio et al. | 216/24 |
| 2002/0197757 A1* | 12/2002 | Hubbard et al. | 438/31 |
| 2003/0196760 A1 | 10/2003 | Tyler et al. | 156/345.47 |
| 2004/0159343 A1* | 8/2004 | Shimbara et al. | 134/33 |
| 2004/0211516 A1 | 10/2004 | Rigali et al. | 156/345.31 |
| 2005/0039853 A1 | 2/2005 | Rigali et al. | 156/345.31 |
| 2005/0269031 A1 | 12/2005 | Tyler et al. | 156/345.48 |

* cited by examiner

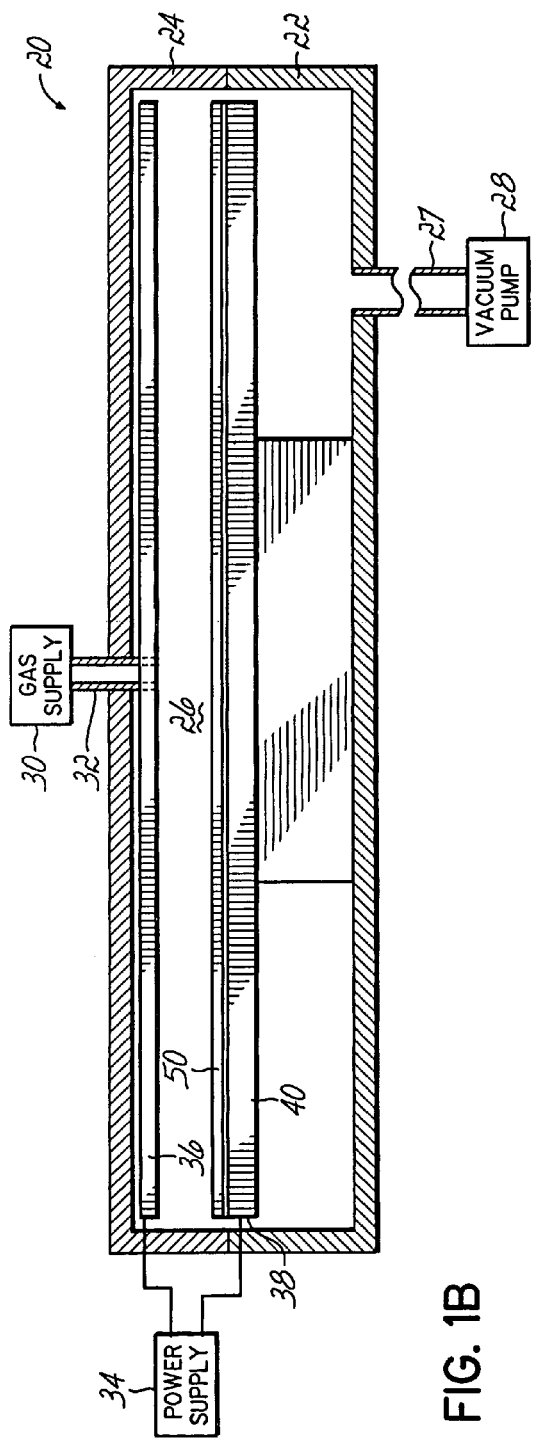
FIG. 1B
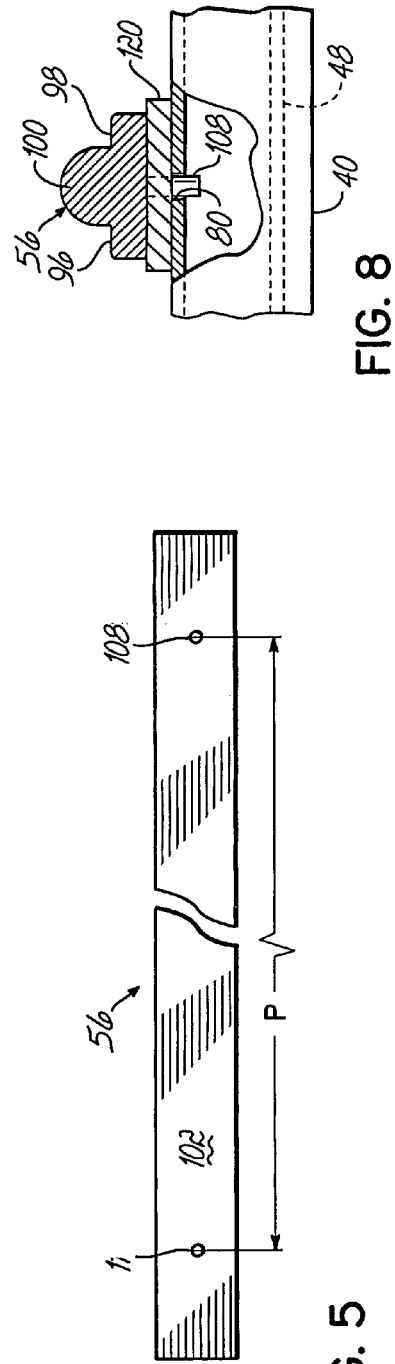
FIG. 8
FIG. 5

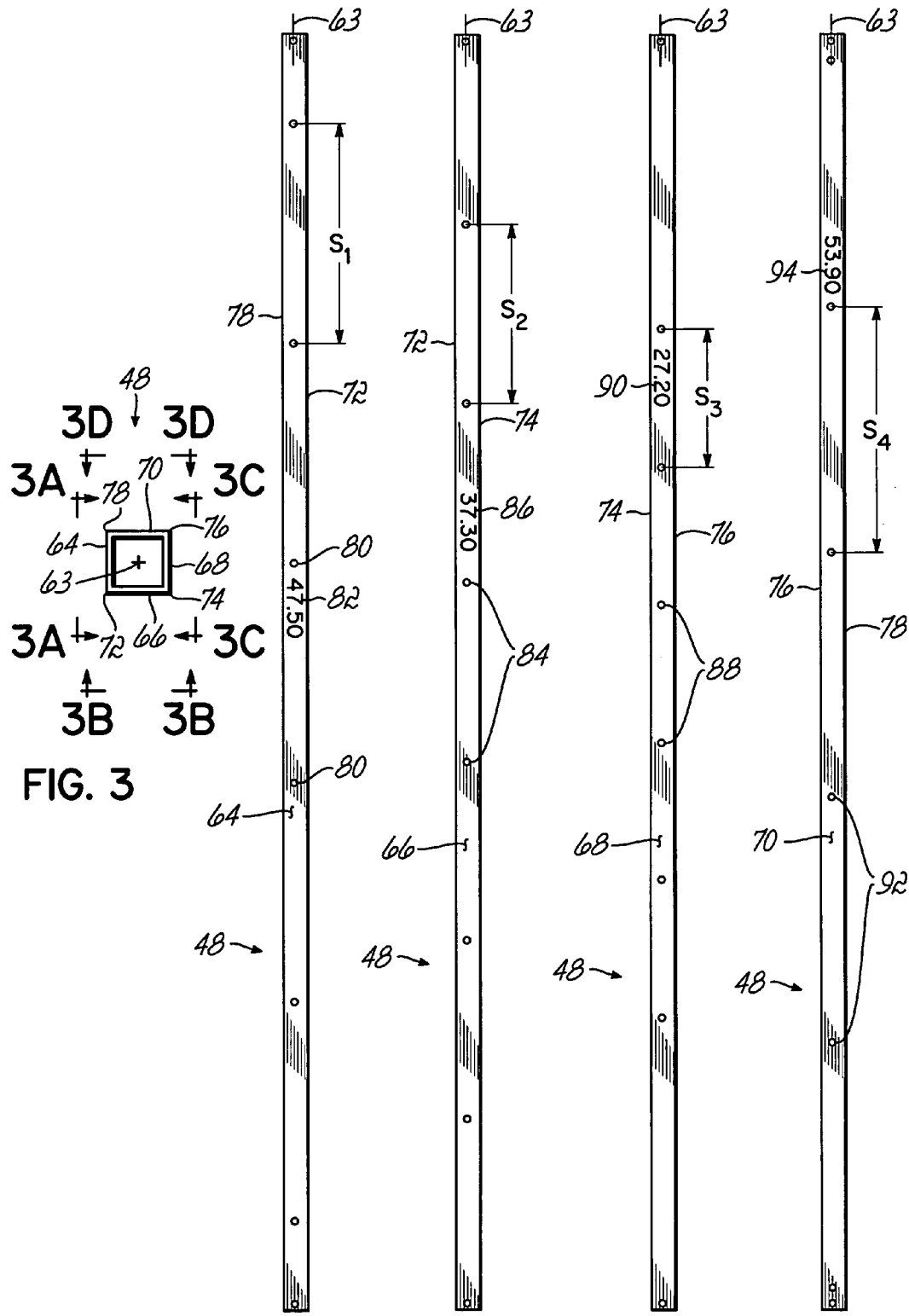

WIDTH ADJUSTABLE SUBSTRATE SUPPORT FOR PLASMA PROCESSING

FIELD OF THE INVENTION

The invention relates generally to plasma processing systems and, more particularly, to an electrode assembly for supporting substrates in a plasma processing system.

BACKGROUND OF THE INVENTION

Plasma processing systems are commonly used for modifying the surface properties of substrates in various industrial applications. For example, plasma processing systems are routinely used to plasma treat the surfaces of integrated circuits, electronic packages, and printed circuit boards in semiconductor applications, solar panels, hydrogen fuel cell components, automotive components, and rectangular glass substrates used in flat panel displays. Often, the substrates that are subjected to plasma processing have the geometrical form factor or shape of rectangular strips with opposite side edges that are substantially parallel.

Conventional plasma processing systems include a plasma chamber and a material handling system that transfers substrates to a processing space inside the plasma chamber for plasma treatment. Traditionally, electrodes inside the plasma chamber of an in-line plasma processing system have included rails used to support the transferred strips during plasma treatment. The rails are supplied in parallel pairs that are ideally aligned with corresponding rails on the material handling system. The rails inside the plasma processing system have a separation selected such that the rails contact side edges of each strip loaded from the material handling system onto the rails.

In one conventional electrode design, the substrate-supporting rails are formed integrally with the rest of the electrode. If the plasma processing system is retooled to plasma treat strips having a different width between the contacted side edges, the entire electrode must be replaced with a different electrode having integral rails with a different relative separation. This results in lost production time for replacing the electrode. Moreover, the integral rails on the new electrode may be misaligned with the rails on the material handling system, which is impossible to remedy with an adjustment to the electrode rails because of their integral construction.

To overcome this deficiency, plasma processing system manufacturers have introduced electrode assemblies with non-integral rails that are movable among multiple different separations across the surface of an electrode. This conventional rail construction features guide bars and rails with set screws that are loosened to change the separation between the rails constrained by the guide bars and tightened to fix the separation between the rails. Typically, an operator will make fiduciary marks on the electrode for use in aligning the rails to accept strips of different widths. However, aligning the rails with fiduciary marks to fix the rail positions is not readily reproducible, especially among multiple different operators, due in large part to the subjectivity involved in aligning the rails with the fiduciary marks. Moreover, the set screws must be loosened and tightened in order to change the distance between adjacent rails, which requires tools and slows the process. Productivity is lost during the time required to loosen each rail, align the rails with a set of fiduciary marks, and then tighten each rail without inadvertently altering the alignment.

It would be desirable, therefore, to provide an electrode construction for a plasma processing system that overcomes these and other deficiencies of conventional electrode constructions.

SUMMARY

In an embodiment of the present invention, an electrode assembly for supporting one or more substrates in a plasma processing system comprises an electrode having a plurality of first connecting members. Associated with the electrode is a plurality of rails that cooperate for supporting the substrates on the electrode. Each of the rails includes a plurality of second connecting members. Each of the second connecting members is connected detachably with one of the first connecting members for removably mounting the rails with the electrode.

In one specific embodiment of the present invention, an electrode assembly for supporting one or more substrates in a plasma processing system includes an electrode having first and second grooves that are aligned substantially parallel. A first bar is positioned in the first groove and a second bar is positioned in the second groove. The electrode assembly further includes a plurality of rails each removably engaged with the first and second bars and each extending between the first and second bars. The rails cooperate for supporting the substrates on the electrode.

The electrode assemblies of the invention may comprise a portion or component of a plasma processing system. The plasma processing system includes a vacuum chamber enclosing a processing space capable of being evacuated to a partial vacuum, a gas port defined in the vacuum chamber for admitting a process gas into the processing space, and a power supply. The electrode assembly is positioned in the processing space and is electrically coupled with the power supply for converting the process gas to the plasma. The electrode assemblies of the invention may also be retrofitted to existing plasma processing systems as a replacement for a conventional electrode.

The electrode assembly of the invention simplifies the process of configuring a plasma processing system to accept workpieces or substrates of a different size by readily adjusting the distance between adjacent substrate-supporting rails. The electrode assembly of the invention reduces or eliminates the potential for misalignment between a material handling system and the plasma processing system because of the high reproducibility in rail position when the electrode assembly is modified to change the spacing between adjacent rails.

These and other objects and advantages of the present invention shall become more apparent from the accompanying drawings and description thereof.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

FIG. 1B is a diagrammatic view of the plasma processing system of FIG. 1;

FIG. 3 is an end view of one of the bars of FIG. 2;

FIG. 3A is a side view taken along line 3A-3A in FIG. 3;

FIG. 3B is a bottom view taken along line 3B-3B in FIG. 3;

FIG. 3C is a side view taken along line 3C-3C in FIG. 3;

FIG. 3D is a top view taken along line 3D-3D in FIG. 3;

FIG. 5 is a bottom view of the central rail of FIG. 4;

FIG. 8 is an end view in partial cross-section similar to FIG. 7 in accordance with an alternative embodiment of the present invention.

DETAILED DESCRIPTION OF THE PREFERRED EMBODIMENTS

Figure 1:
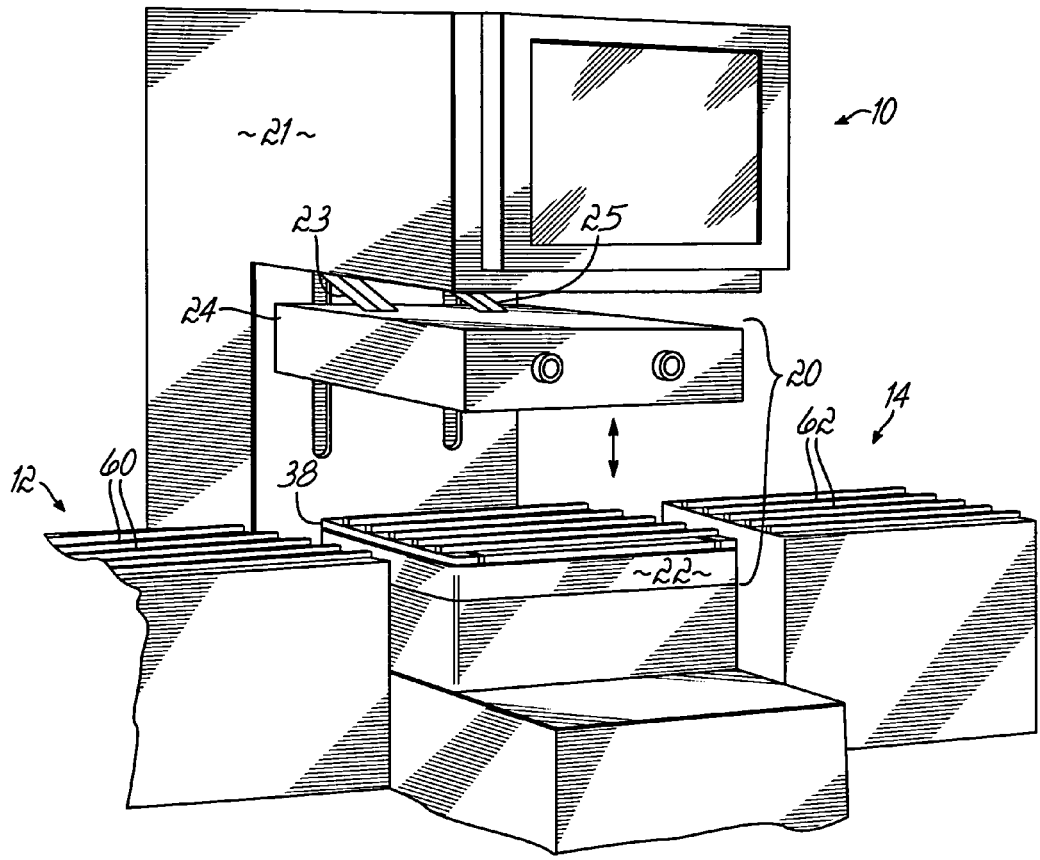
FIG. 1 is a perspective side view of a plasma processing system having an electrode assembly in accordance with an embodiment of the invention flanked by inlet-side and outlet-side material handling systems.
Figure 1A:
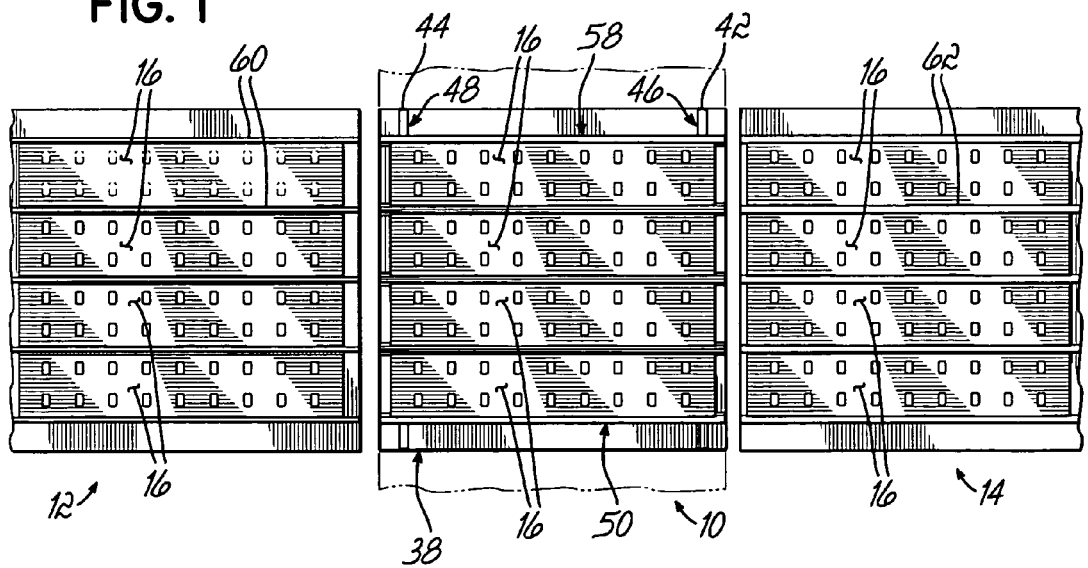
FIG. 1A is a top view of the plasma processing system of FIG. 1 shown from a perspective beneath the chamber lid and shown with unprocessed substrates supported by the inlet-side material handling system on the left, substrates to be processed supported by the plasma processing system, and processed substrates supported by the outlet-side material handling system.

With reference to FIGS. 1, 1A and 1B, a plasma processing system 10 is flanked on an inlet side by a first material handling system 12 and on an outlet side by a second material handling system 14. Material handling system 12 includes structure (not shown) that is capable of transferring a plurality of substrates 16 to the plasma processing system 10 for plasma treatment. Material handling system 12 includes structure (not shown) that is capable of removing the processed substrates 16 from the plasma processing system 10. Each of the material handling systems 12, 14 may include structure, such as pinch wheels, pusher arms, and other mechanisms, for manipulating substrates 16 as understood by a person having ordinary skill in the art.

The plasma processing system 10 includes a chamber 20 consisting of a chamber base 22 and a chamber lid 24. The chamber lid 24 is movable relative to the chamber base 22 between an opened position that permits access for substrate exchanges and a closed position. When the chamber lid 24 is in the closed position, an environment is created inside the chamber 20 suitable for plasma treatment of one or more substrates 16. In its closed position, the chamber lid 24 is lowered such that a peripheral rim of the chamber lid 24 contacts a peripheral rim of the chamber base 22 in a sealing relationship that isolates a processing space 26 from the ambient atmosphere. When the chamber lid 24 is in the opened position, the chamber lid 24 is suspended from a pair of arms 23, 25 above the chamber base 22. The arms 23, 25 are vertically movable for providing the opened and closed positions of the chamber lid 24 relative to the chamber base 22.

The processing space 26 defined inside the atmospherically-sealed chamber 20, which is created when the chamber lid 24 is closed, is evacuatable to a partial vacuum by a vacuum pump 28 coupled with a vacuum port 27 defined in chamber 20. A gas supply 30 is coupled with a gas port 32 defined in chamber 20 and transfers a stream of an ionizable process gas to the processing space 26 inside the atmospherically-sealed chamber 20. After an initial evacuation to remove atmospheric gases from the processing space 26, the mass flow of process gas from the gas supply 30 to the processing space 26 and the pumping rate of spent and fresh process gases from the processing space 26 are regulated to provide a sub-atmospheric chamber pressure suitable for plasma treatment of substrates 16.

A power supply 34, such as a radiofrequency (RF) power supply, is electrically coupled with an electrode 36 associated with the chamber lid 24 and an electrode assembly 38 associated with the chamber base 22. When the chamber 20 is sealed, evacuated, and supplied with process gas, the electrode 36 and electrode assembly 38 are energized by the power supply 34. An electromagnetic field between the energized electrode 36 and electrode assembly 38 interacts with the process gas to generate a plasma inside the processing space 26. If the power supply 34 supplies RF current to electrode 36 and electrode assembly 38, the electromagnetic field interacting with the process gas inside the chamber 20 is time-varying. The substrates 16, which are positioned in the processing space 26 between the electrode 36 and electrode assembly 38, are exposed to the plasma to accomplish a plasma treatment.

The vacuum pump 28, gas supply 30, and power supply 34 have a construction understood by a person having ordinary skill in the art and will not be elaborated upon herein. The chamber 20 will also include various seals, gaskets, feedthroughs, etc. (not shown) required to provide an environment inside the chamber 20 suitable for plasma generation, as understood by a person having ordinary skill in the art.

Figure 2:
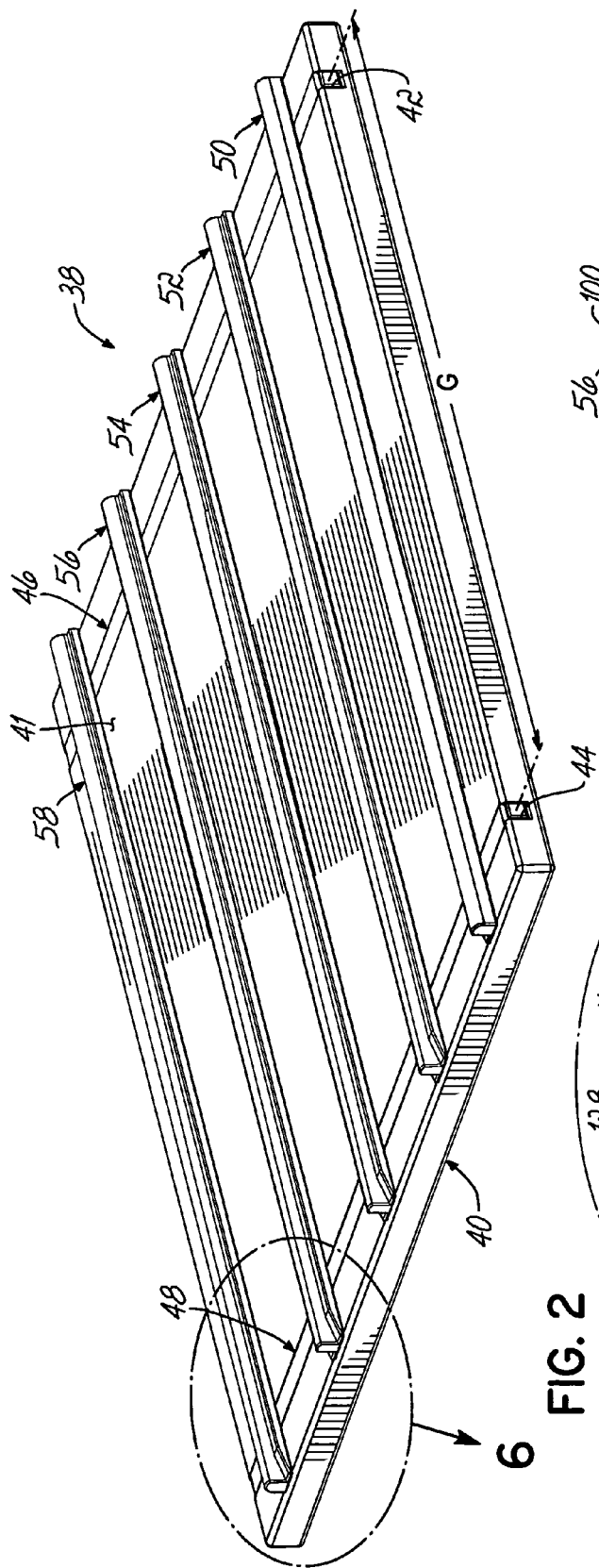
FIG. 2 is a perspective view of the electrode assembly of FIG. 1.

With reference to FIG. 2 in which like reference numerals refer to like features in FIGS. 1, 1A, and 1B, the electrode assembly 38 associated with the chamber base 22 includes an electrode 40 having grooves 42, 44 that each receive one of a pair of bars 46, 48 to form an assembly. The grooves 42, 44 are generally parallel and are located near, and slightly inset from, opposite peripheral side edges of the electrode 40. The depth of the grooves 42, 44 may be chosen such that an upper surface of each of the bars 46, 48 is substantially flush with an upper surface 41 of the electrode 40 when the bars 46, 48 are situated inside the grooves 42, 44. The cross-sectional profile of the bars 46, 48 may be complementary to the cross-sectional profile of the grooves 42, 44. Preferably, the bars 46, 48 may be interchangeably positioned among the grooves 42, 44.

Associated with the bars 46, 48 is a plurality of, for example, five guide and support rails 50, 52, 54, 56, 58 of which rails 50, 58 are peripheral rails and rails 52, 54, 56 are central rails positioned on the surface of the electrode 40 between rail 50 and rail 58. The rails 50, 52, 54, 56, 58 are aligned substantially orthogonal or perpendicular to the bars 46, 48. The rails 50, 52, 54, 56, 58, which have a mutually parallel arrangement, are substantially collinear with a corresponding plurality of rails 60 associated with material handling system 12 to define a plurality of lanes along which unprocessed substrates 16 are loaded into the chamber 20. Similarly, the rails 50, 52, 54, 56, 58 are substantially collinear with a corresponding plurality of rails 62 associated with material handling system 14 to define a plurality of lanes along which processed substrates 16 are unloaded into the chamber 20. Each of the lanes is defined between an adjacent pair of rails 60, between an adjacent pair of rails 62, and between adjacent pairs of rails 50, 52, 54, 56, 58 so that the material handling systems 12, 14 and the plasma processing system 10 have an equivalent number of lanes. A person having ordinary skill in the art will appreciate that the specific number of rails may vary contingent upon, among other factors, the dimensions of the substrate 16 and the dimensions of the chamber 20.

Rails 50, 52, 54, 56, 58 cooperate for supporting the substrates 16 in a distanced relationship with the upper surface 41 of the electrode 40. Specifically, the rails 50, 52, 54, 56, 58 elevate the substrates 16 above the upper surface 41 of electrode 40 during plasma treatment that exposes the substrates 16 to the plasma in the processing space 26.

With reference to FIGS. 3 and 3A-D in which like reference numerals refer to like features in FIGS. 1, 1A, 1B, and 2, bar 48 may be centered about a longitudinal axis 63. Bar 48, which may be tubular, includes a plurality of sides 64, 66, 68, 70 of substantially equal area that face outwardly and define the exterior surface of the bar 48. Sides 64 and 66 intersect along right-angle corner 72, sides 66 and 68 intersect along right-angle corner 74, sides 68 and 70 intersect along right-angle corner 76, and sides 70 and 64 intersect along right-angle corner 78. As such, bar 48 has a four-sided polygonal cross-sectional profile.

As best shown in FIG. 3A, arranged along the length of side 64 is a plurality of openings 80 in which the adjacent pairs of openings 80 are separated by a spacing $S_1$. The openings 80 are aligned linearly and are centrally positioned between right-angle corners 72, 78 that border the longitudinal edges of side 64. Side 64 includes an identifier 82 that may be inscribed into the material forming bar 48. The identifier 82 provides a ready indication to an operator of the value of the opening spacing $S_1$ so that the operator can reliably determine the distance between adjacent openings 80.

As best shown in FIG. 3B, a plurality of openings 84 is also arranged along the length of side 66 in which the adjacent pairs of openings 84 are separated by a spacing $S_2$. The openings 84 are aligned linearly and are centrally positioned between right-angle corners 72, 74 that border the longitudinal edges of side 66. Side 66 includes an identifier 86 that may be inscribed into the material forming bar 48. The identifier 86 provides an indication to an operator of the value of the opening spacing $S_2$ so that the operator can readily and reliably determine the distance between adjacent openings 84.

Similarly and as best shown in FIG. 3C, a plurality of openings 88 is arranged along the length of side 68. The adjacent pairs of openings 88 are separated by a spacing $S_3$. The openings 88 are aligned linearly and are centrally positioned between right-angle corners 74, 76 that border the longitudinal edges of side 68. Side 68 includes an identifier 90 that may be inscribed into the material forming bar 48. The identifier 90 provides an indication to an operator of the value of the opening spacing $S_3$ so that the operator can readily and reliably determine the distance between adjacent openings 88.

As best shown in FIG. 3D, a plurality of openings 92 is also arranged along the length of side 70. The adjacent pairs of openings 92 are separated by a spacing $S_4$. The openings 92 are aligned linearly and are centrally positioned between right-angle corners 76, 78 that border the longitudinal edges of side 70. Side 70 includes an identifier 94 that may be inscribed into the material forming bar 48. The identifier 94 provides an indication to an operator of the value of the opening spacing $S_4$ so that the operator can readily and reliably determine the distance between adjacent openings 92.

The identifiers 82, 86, 90, 94 may be formed in the bar 48 by other vacuum-compatible methods as understood by persons having ordinary skill in the art. When the bar 48 is installed in groove 42, only one of the sets of openings 80, 84, 86, 88 is exposed as the remaining three sets of openings 80, 84, 86, 88 are hidden by portions of the electrode 40 bounding the groove 42. The exposed one of the sides 64, 66, 68, 70 and, hence, the exposed set of openings 80, 84, 86, 88, is changed by lifting the bar 48 and rotating the bar 48 about longitudinal axis 63.

The identifiers 82, 86, 90, 94 permit rapid identification of the particular opening spacing on each of the sides 64, 66, 68, 70. Each of the identifiers 82, 86, 90, 94 may comprise at least one alphanumeric character indicative or suggestive of the corresponding distance or spacing between adjacent pairs of openings 80, 84, 88, 92, respectively. Alternatively, the identifiers 82, 86, 90, 94 may comprise simple non-alphanumeric geometrical shapes, such as bars or circles, indicative or suggestive of the corresponding distance or spacing between adjacent pairs of openings 80, 84, 88, 92, respectively. The invention may, in an alternative embodiment, mark fewer than all of the sides 64, 66, 68, 70 by omitting one or more of the corresponding identifiers 82, 86, 90, 94.

Bar 46 has a construction substantially identical to the construction of bar 48 so that each of the bars 46, 48 may be installed in either of the grooves 42, 44 in electrode 40. When bar 48 is installed in groove 44, one of the sides 64, 66, 68, 70 is exposed and visible. Similarly, when bar 46 is installed in groove 42, a side of bar 46 corresponding to the exposed one of sides 64, 66, 68, 70 of bar 48 is exposed and visible. The bars 46, 48 are positioned in their respective grooves 42, 44 such that the openings in bar 48, for example openings 80 on side 64, directly opposite to the openings 80 in side 64 of bar 46. This correlation ensures that the installed rails 50, 52, 54, 56, 58 have a substantially parallel relationship with a uniform spacing between adjacent pairs of rails 50, 52, 54, 56, 58. The spacing between adjacent pairs of rails 50, 52, 54, 56, 58 is readily determined by reference to the corresponding one of the identifiers 82, 86, 90, 94 on bars 46, 48 and is specified by the accessible set of openings 80, 84, 88, 92.

In alternative embodiments of the present invention, the bars 46, 48 may have different configurations. For example, the grooves 42, 44 and bars 46, 48 may have a different complementary cross-sectional profiles, such as a complementary polygonal cross-sectional profiles with less than or more than four contiguous sides.

In other alternative embodiments of the present invention, fewer than all of the sides 64, 66, 68, 70 of bars 46, 48 may include the respective set of openings 80, 84, 88, 92. For example, only two sides, such as sides 64 and 66, of each of the bars 46, 48 may be populated with openings 80, 82, respectively, as shown in FIG. 3, and the remaining sides 68, 70 may omit openings. In this instance, another set of bars (not shown) may be provided that have sides populated with openings having the same spacings as openings 80, 82 of bars 46, 48 so that this new set of bars and bars 46, 48 with populated sides 64, 66 will provide the same set of possible rail spacings as bars 46, 48 with populated sides 64, 66, 68, 70.

In yet other alternative embodiments of the present invention, a set of four bars (not shown) may each include only a single side that is populated with openings and be useable as a substitute for at least one of the bars 46, 48. In this instance, the four bars would have one side similar in appearance to FIGS. 3A-D.

With reference to FIGS. 4, 4A, 4B, and 5 in which like reference numerals refer to like features in FIGS. 1-3, rail 56, which is representative of rail 52 and rail 54, includes a pair of support surfaces or shelves 96, 98 separated by a central divider 100. The support shelves 96, 98 extend between opposite ends 105, 107 of the rail 56. The support shelves 96, 98 are spaced from a bottom surface 102 that is adjacent to the electrode 40 when the rail 56 is mounted to bars 46, 48. The support shelves 96, 98 each include a beveled surface 104, 106, respectively, at the end 105 of rail 56 that faces toward material handling system 12 when the rail 56 is coupled with bars 46, 48. The beveled surfaces 104, 106 are used to guide substrates 16 transferred from rails 60 of material handling system 12 vertically to provide a tolerance for vertical misalignment of rails 60 with rail 56 and the other rails 52, 54 that also include the beveled ends 104, 106.

The central divider 100 has opposite sidewalls 116, 118 that extend vertically to intersect with a corresponding one of the support shelves 96, 98. The separation, $W_1$, between the sidewalls 116, 118 at end 105 is narrower than the separation, $W_2$, between the sidewalls 116, 118 at any point along the length of the rail 56. As a result, the support shelves 96, 98 are wider near end 105, which is adjacent to the rails 60 of material handling system 12, than near end 107, which is adjacent to the rails 62 of material handling system 14. Each of the support shelves 96, 98 attains a minimum width at a location L from end 105 and has a constant width from that location to end 107. The increased width of the support shelves 96, 98 near end 105 operates to correct lateral misalignment of the substrates 16 during loading. In one specific embodiment of the invention, divider 100 has a width $W_1$ at end 105 equal to about 4.5 mm and a maximum width $W_2$ near end 107 equal to about 6.5 mm, and the location L is about 260 mm from end 105.

Projecting from the bottom surface 102 of rail 56 is a pair of pins or posts 108, 110 that are used to engage the rail 56 with the bars 46, 48. Post 108 is spaced along the length of rail 56 from post 110 by a distance, P, substantially equal to the mid-line distance, G, between grooves 42, 44 in electrode 40, as shown in FIG. 2. The coupling of posts 108, 110 with the openings 80 on side 64, as well as openings 84, 88, 92 on sides 66, 68, 70, respectively, is highly reproducible. The posts 108, 110 have a fixed separation and the openings 80, 84, 88, 92 have a fixed separation, which eliminates user subjectivity when adjusting the position of rail 56, and rails 50, 52, 54, 58.

Figure 4:
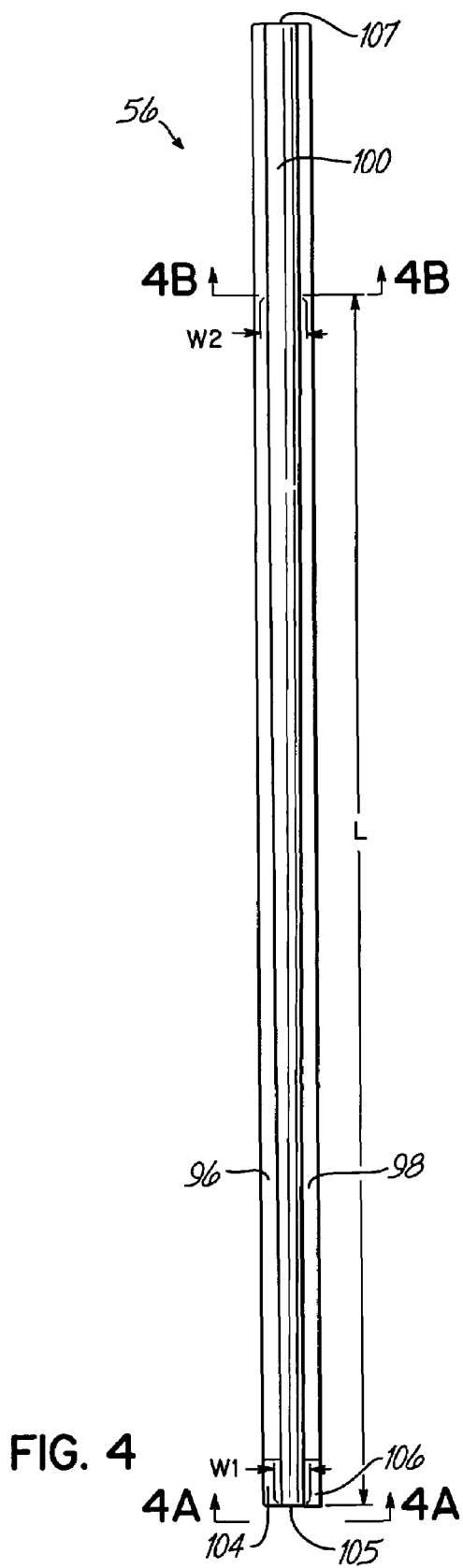
FIG. 4 is a top view of one of the central rails of FIG. 2.
Figure 4A:
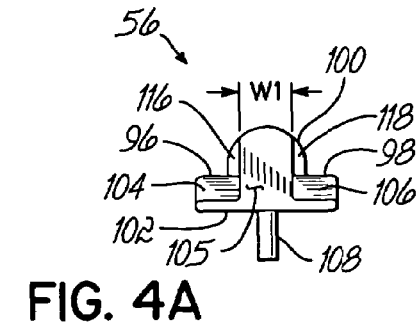
FIG. 4A is an end view of the rail of FIG. 4.
Figure 4B:
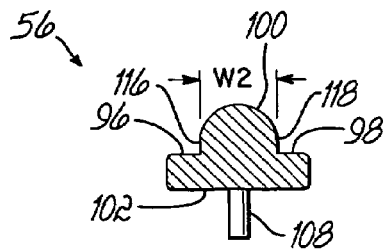
FIG. 4B is a cross-sectional view taken generally along line 4B-4B of FIG. 4.
Figure 4C:
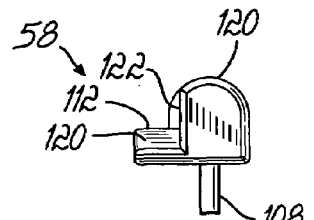
FIG. 4C is an end view similar to FIG. 4A of one peripheral rail of FIG. 2.
Figure 4D:
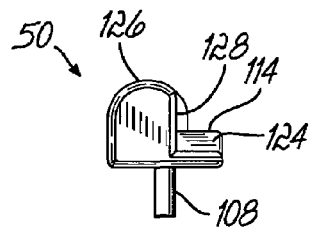
FIG. 4D is an end view similar to FIG. 4A of the opposite peripheral rail of FIG. 2.

With reference to FIG. 4C in which like reference numerals refer to like features in FIG. 4B, rail 58 is a peripheral rail and has a single support shelf 112 that is constructed identical to support shelf 96 on rail 56 (FIG. 4B). The support shelf 112 has a beveled surface 120 similar or identical to beveled surfaces 104, 106 (FIG. 4A) on rail 56, a divider 120 similar or identical to divider 100 (FIG. 4A) on rail 56, and a sidewall 122 similar or identical to sidewall 116 (FIG. 4A). With reference to FIG. 4D, rail 50, which is also a peripheral rail, has a single support shelf 114 that is constructed identical to support shelf 98 on rail 56 (FIG. 4B). The support shelf 114 has a beveled surface 124 similar or identical to beveled surfaces 104, 106 (FIG. 4A) on rail 56, a divider 126 similar or identical to divider 100 (FIG. 4A) on rail 56, and a sidewall 128 similar or identical to sidewall 116 (FIG. 4A).

Figure 6:
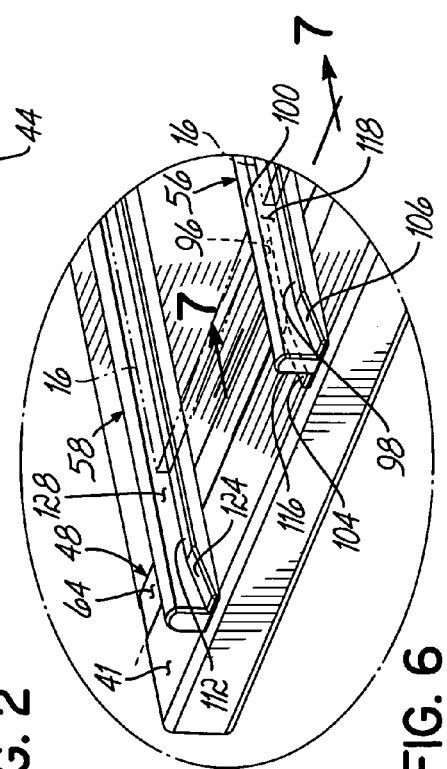
FIG. 6 is a detailed view of an encircled region in FIG. 2.
Figure 7:
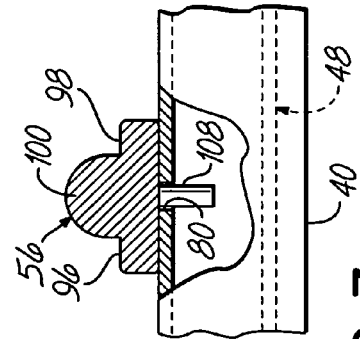
FIG. 7 is an end view in partial cross-section taken generally along line 7-7 in FIG. 6 showing the coupling between a central rail and a bar of the electrode assembly.

With reference to FIGS. 6 and 7 in which like reference numerals refer to like features in FIGS. 1-5, rail 56 has one end coupled by pin 108 with one of the openings 80 in side 64 of bar 46 and an opposite end coupled by pin 110 with one of the openings 80 in side 64 of bar 48. Pins 108, 110 project through the openings 80 and partially into the interior of the bars 46, 48, respectively. Rails 50, 52, 54, 58 have an engagement with bars 46, 48 that is substantially identical to the engagement between rail 56 and bars 46, 48. Of course, another of the sides 66, 68, 70 of each of the bars 46, 48 may be exposed to change the width of the substrate 16 being plasma processed by the plasma processing system 10. The rails 50, 52, 54, 58, when engaged with the bars 46, 48, extend between the bars 46, 48.

The bars 46, 48, grooves 42, 44, and openings 80, 84, 88, 92 operate as one set of connecting members and the pins 108, 110 of each of the rails 50, 52, 54, 58 operate as a second complementary set of connecting members that detachably engage one set of openings 80, 84, 88, 92 for detachably connecting the rails 50, 52, 54, 58 with the electrode 40 to form electrode assembly 38. These complementary connecting member constructions may be varied for detachably connecting the rails 50, 52, 54, 58 with the electrode 40. For example, the pins 108, 110 and openings 80, 84, 88, 92 may have different complementary geometrical shapes. Alternatively, the pins 108, 110 and openings 80, 84, 88, 92 may be replaced with a different construction that provides the same certainty and reproducibility in detachably connecting the rails 50, 52, 54, 58. As another example, the grooves 42, 44 and bars 46, 48 may be shaped and dimensioned such that a portion of each of the bars 46, 48 project above the electrode 40 and the rails 50, 52, 54, 58 may be formed with recesses (not shown) near each opposite end that receive the projecting portion of the respective bars 46, 48.

With reference to FIG. 8 in which like reference numerals refer to like features in FIGS. 1-7, an optional height-adjustment member in the form of spacer 120 may be inserted between the rail 56 and the bar 48 and another optional height-adjustment member or spacer (not shown) similar or identical to spacer 120 may be inserted between the rail 56 and the bar 46 for changing the height of the support shelves 96, 98 above the upper surface of electrode 40. This adjustment permits the vertical position of rail 56 to be adjusted relative to the electrode 40 to match the vertical position of the rails 60 of material handling system 12. Spacer 120 may be a washer-like annular structure that is installed about the pin 108 or have another construction. Similar spacers (not shown) may be provided for adjusting the vertical height of the other rails 50, 52, 54, 58.

To configure the electrode assembly 38 of plasma processing system 10 for handling substrates 16 of differing width and with reference to FIGS. 1-8, the chamber lid 24 is moved relative to the chamber base 22 to the opened position to permit access to the electrode assembly 38. The rails 50, 52, 54, 56, 58 are removed by a vertical lifting motion that releases the pins 108, 110 from their confinement. The bars 46, 48 are each re-oriented within grooves 42, 44 of electrode 40 such that the same corresponding one of the sides 64, 66, 68, 70 is exposed along the top surface of electrode 40. Alternatively, another set of bars (not shown) with different opening spacings may be installed in grooves 42, 44. The rails 50, 52, 54, 56, 58 are re-installed by coupling with grooves 42, 44, unless the number of rails is changed to accommodate material handling systems 12, 14 with a different number of lanes. The optional spacers 120 may be installed for increasing the distance separating the support shelves 92, 94 on rails 52, 54, 58, support shelf 112 on rail 58, and support shelf 114 on rail 50 from electrode 40.

During use, a side edge of at least one substrate 16 may contact each of the support shelves 92, 94 on rails 52, 54, 58, support shelf 112 on rail 58, and support shelf 114 on rail 50. For example and as shown in FIG. 6, one of the substrates 16 has a side edge supported on support shelf 98 of rail 56 and another side edge supported on support shelf 112 of rail 58.

The electrode 40, rails 50, 52, 54, 56, 58, and bars 46, 48 may be formed from a conductive material, such as aluminum or an aluminum alloy. The pins 108, 110 may be formed from a stainless steel for durability in repeatedly coupling and uncoupling rails 50, 52, 54, 56, 58 from bars 46, 48. When assembled, the electrode 40, rails 50, 52, 54, 56, 58, and bars 46, 48 comprise a conductive electrode assembly.

A second set of bars (not shown) may be supplied for use with electrode assembly 38 that have opening spacings that differ from the specific opening spacings of bars 46, 48. The opening spacings may be selected to meet a particular customer's requirements for strip width. Rails 50, 52, 54, 56, 58 are designed to be used with any arbitrary set of bars 46, 48. Hence, only a single set of rails 50, 52, 54, 56, 58 is required. However, the specific number of rails may vary depending upon the number of substrate lanes to be provided on electrode assembly 38. For example, rails 50, 52, 54 and 58 may be used if the electrode assembly 38 only includes three lanes for receiving substrates 16, instead of four lanes. As another example, rails 50 and 58 may be used if electrode assembly 38 includes only a single lane for receiving substrates 16.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept. The scope of the invention itself should only be defined by the appended claims, wherein I claim:

The invention claimed is:

1. An electrode assembly for supporting one or more substrates of a first size or one or more substrates of a second size in a plasma processing system, the electrode assembly comprising:
   an electrode;
   first and second bars each having a first side, a plurality of first openings on said first side, a second side, and a plurality of second openings on said second side, each adjacent pair of first openings separated by a first spacing along a length of said first side, and each adjacent pair of said second openings separated by a second spacing different from said first spacing along a length of said second side; and
   a plurality of rails configured to support the substrates in a distanced relationship above said electrode, said rails extending substantially orthogonally from said first bar to said second bar, each of said rails including a plurality of connecting members, and said connecting members configured to be connected detachably with said first openings in said bars so that adjacent pairs of said rails are spaced to support the one or more substrates of the first size, and said connecting members configured to be connected detachably with said second openings in said bars so that the adjacent pairs of said rails are spaced to support the one or more substrates of the second size.

2. The electrode assembly of claim 1 wherein said electrode includes a plurality of substantially parallel grooves, each of said first and second bars positioned removably in a respective one of said grooves so as to expose said first openings or said second openings.

3. The electrode assembly of claim 2 wherein each of said connecting members is a pin projecting from a corresponding one of said rails, and each of said pins is sized to be inserted into one of said first openings or into one of said second openings.

4. The electrode assembly of claim 2 wherein each of said bars includes a first side with said first openings, a second side with said second openings, a corner joining said first side with said second side, and a longitudinal axis, and each of said rails is configured to be rotated about said longitudinal axis before each of said bars is positioned removably in the respective one of said grooves so as to expose said first openings or said second openings.

5. The electrode assembly of claim 1 wherein each of said bars includes a first identifier that is related to said first spacing and a second identifier that is related to said second spacing.

6. The electrode assembly of claim 1 wherein each of said rails further comprises a first end, a second end, and a support surface extending longitudinally between said first and second ends, a portion of said support surface of at least one of said rails declined in a direction toward said first end and intersecting said first end, and said support surface portion operating to correct vertical misalignment of one of the substrates being loaded onto said support surface.

7. The electrode assembly of claim 1 wherein each of said rails further comprises a first end, a second end, and a support surface extending longitudinally between said first and second ends, a portion of said support surface of at least one of said rails widening in a direction toward said first end and intersecting said first end, and said support surface portion operating to correct lateral misalignment of one of the substrates being loaded onto said support surface.

8. The electrode assembly of claim 1 wherein each of said rails includes a support surface, and further comprising:
   a plurality of height-adjustment members removably inserted between said rails and said electrode, said height-adjustment members cooperating for increasing a distance separating said support surface from said electrode.

9. An electrode assembly for supporting one or more substrates in a plasma processing system, the electrode assembly comprising:
   an electrode including a first groove and a second groove aligned substantially parallel to said first groove;
   a first bar in said first groove;
   a second bar in said second groove; and
   a plurality of rails extending substantially orthogonally from said first bar to said second bar, said rails configured to support the substrates in a distanced relationship above said electrode, each of said rails connected detachably with said first and second bars for removably mounting said rails with said electrode, said first bar and said second bar each including a first side with a plurality of first openings and a second side with a plurality of second openings, adjacent pairs of said first openings being separated by a first spacing along a length of said first side to define a first distance between adjacent pairs of said rails, and adjacent pairs of said second openings being separated by a second spacing along a length of said second side that is different from said first spacing to define a second distance between said adjacent pairs of said rails.

10. The electrode assembly of claim 9 wherein each of said rails includes a first pin sized to be inserted into one of said openings in said first bar and a second pin sized to be inserted into one of said openings in said second bar.

11. The electrode assembly of claim 9 wherein said first side includes a first identifier that is related to said first spacing and said second side includes a second identifier that is related to said second spacing.

12. The electrode assembly of claim 11 wherein at least one of said first identifier or said second identifier comprises at least one alphanumeric character.

13. A processing system for treating one or more substrates of a first size or one or more substrates of a second size with a plasma, the processing system comprising:
a vacuum chamber enclosing a processing space capable of being evacuated to a partial vacuum;
a gas port defined in said vacuum chamber for admitting a process gas into said processing space;
a power supply; and
an electrode assembly positioned in said processing space and electrically coupled with said power supply for converting the process gas to the plasma, said electrode assembly including an electrode, a plurality of bars each having a plurality of first openings separated by a first spacing along a length thereof and a plurality of second openings separated along a length thereof by a second spacing different from said first spacing, and a plurality of rails configured to support the substrates in a distanced relationship above said electrode, said rails extending substantially orthogonally from said first bar to said second bar, each of said rails including a plurality of connecting members, and said connecting members configured to be connected detachably with said first openings in said bars so that said rails are spaced to support the one or more substrates of the first size, and said connecting members configured to be connected detachably with said second openings in said bars so that said rails are spaced to support the one or more substrates of the second size.

14. The processing system of claim 13 wherein said electrode includes a plurality of substantially parallel grooves, each of said bars positioned removably in a respective one of said grooves so as to expose said first openings or said second openings.

15. The processing system of claim 14 wherein each of said connecting members is a pin projecting from a corresponding one of said rails, and each of said pins is sized to be inserted into one of said first openings or into one of said second openings.

16. The processing system of claim 14 wherein each of said bars includes a first side with said first openings, a second side with said second openings, a corner joining said first side with said second side, and a longitudinal axis, and each of said rails is configured to be rotated about said longitudinal axis before each of said bars is positioned removably in the respective one of said grooves so as to expose said first openings or said second openings.

17. The processing system of claim 13 wherein each of said bars includes a first identifier that is related to said first spacing and a second identifier that is related to said second spacing.

18. The processing system of claim 13 wherein each of said rails further comprises a first end, a second end, and a support surface extending longitudinally between said first and second ends, a portion of said support surface of at least one of said rails declined in a direction toward said first end and intersecting said first end, and said support surface portion operating to correct vertical misalignment of one of the substrates being loaded onto said support surface.

19. The processing system of claim 13 wherein each of said rails further comprises a first end, a second end, and a support surface extending longitudinally between said first and second ends, a portion of said support surface of at least one of said rails widening in a direction toward said first end and intersecting said first end, and said support surface portion operating to correct lateral misalignment of one of the substrates being loaded onto said support surface.

20. The processing system of claim 13 wherein each of said rails includes a support surface, and further comprising:
a plurality of height-adjustment members removably inserted between said rails and said electrode, said height-adjustment members cooperating for increasing a distance separating said support surface from said electrode.

* * * * *

UNITED STATES PATENT AND TRADEMARK OFFICE
CERTIFICATE OF CORRECTION

PATENT NO. : 7,455,735 B2  
APPLICATION NO. : 11/239570  
DATED : November 25, 2008  
INVENTOR(S) : Thomas V. Bolden, II Page 1 of 1

It is certified that error appears in the above-identified patent and that said Letters Patent is hereby corrected as shown below:

Column 6:  
Line 27, before "directly", insert --are--  
Line 38, change "profiles" to --profile--  
Line 39, change "profiles" to --profile--.

Signed and Sealed this

Seventeenth Day of November, 2009

David J. Kappos  
*Director of the United States Patent and Trademark Office*

UNITED STATES PATENT AND TRADEMARK OFFICE
CERTIFICATE OF CORRECTION

| | |
|---|---|
| PATENT NO. | : 7,455,735 B2 |
| APPLICATION NO. | : 11/239570 |
| DATED | : November 25, 2008 |
| INVENTOR(S) | : Thomas V. Bolden, II |

It is certified that error appears in the above-identified patent and that said Letters Patent is hereby corrected as shown below:

In the Claims

At column 10, claim number 4, line number 1, change "rails" to --bars--.

At column 12, claim number 16, line number 4, change "rails" to --bars--.

Signed and Sealed this
Fifteenth Day of October, 2013

Teresa Stanek Rea
*Deputy Director of the United States Patent and Trademark Office*